United States Patent
Lim

(10) Patent No.: US 11,131,878 B2
(45) Date of Patent: Sep. 28, 2021

(54) DISPLAY DEVICE AND METHOD OF MANUFACTURING THE SAME

(71) Applicant: Samsung Display Co., Ltd., Yongin-si (KR)

(72) Inventor: Ho Lim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/032,773

(22) Filed: Jul. 11, 2018

(65) Prior Publication Data

US 2019/0171063 A1 Jun. 6, 2019

(30) Foreign Application Priority Data

Dec. 5, 2017 (KR) .................. 10-2017-0165959

(51) Int. Cl.
*G02F 1/1333* (2006.01)
*G02F 1/1335* (2006.01)
*H01L 27/32* (2006.01)
*H01L 51/52* (2006.01)

(52) U.S. Cl.
CPC .... *G02F 1/133528* (2013.01); *G02F 1/13338* (2013.01); *G02F 1/133308* (2013.01); *H01L 27/3246* (2013.01); *H01L 51/5206* (2013.01); *H01L 51/5221* (2013.01); *H01L 51/5237* (2013.01); *H01L 51/5281* (2013.01); *G02F 1/13332* (2021.01); *G02F 1/133331* (2021.01); *G02F 1/133541* (2021.01); *G02F 2201/121* (2013.01); *G02F 2201/123* (2013.01); *G02F 2203/023* (2013.01); *G02F 2203/026* (2013.01)

(58) Field of Classification Search
CPC ............. H01L 51/5237; H01L 51/5253; H01L 51/5281; G02F 2001/133331
See application file for complete search history.

(56) References Cited

U.S. PATENT DOCUMENTS

| | | | |
|---|---|---|---|
| 2012/0113672 A1* | 5/2012 | Dubrow | B82Y 20/00 362/602 |
| 2017/0009959 A1* | 1/2017 | Shida | F21V 11/00 |
| 2017/0179436 A1* | 6/2017 | Huang | H01L 51/56 |
| 2017/0212295 A1 | 7/2017 | Vasylyev | |
| 2017/0222075 A1 | 8/2017 | Collins et al. | |

(Continued)

FOREIGN PATENT DOCUMENTS

| KR | 10-2007-0099998 A | 10/2007 |
|---|---|---|
| KR | 10-2008-0071408 A | 8/2008 |

(Continued)

OTHER PUBLICATIONS

Machine translation of Application KR20070099998 (Year: 2007).*

(Continued)

*Primary Examiner* — Dennis P Joseph
(74) *Attorney, Agent, or Firm* — Lewis Roca Rothgerber Christie LLP

(57) ABSTRACT

A display device includes: a display panel including a plurality of display elements; a window member disposed on the display panel; and a plurality of first light conversion members that convert the path of light emitted from the display elements and whose cross sections are about 450 nm to about 950 nm in diameter, wherein the first light conversion members directly contact a surface of the window member.

14 Claims, 15 Drawing Sheets

(56) References Cited

U.S. PATENT DOCUMENTS

2019/0018183 A1* 1/2019 Ochi .................. G02B 6/0061
2019/0348578 A1* 11/2019 Kuniyasu ............. H01L 33/501

FOREIGN PATENT DOCUMENTS

| KR | 10-2012-0093095 | 8/2012 |
| KR | 10-2014-0087465 | 7/2014 |
| KR | 10-2014-0096328 | 8/2014 |
| KR | 10-2015-0095558 | 8/2015 |

OTHER PUBLICATIONS

Bathelt et al., "Light extraction from OLEDs for lighting applications through light scattering," Organic Electronics, vol. 8, 2007, 7 pages.
Madigan et al., "Improvement of output coupling efficiency of organic light-emitting diodes by backside substrate modification," Appl. Phys. Lett., vol. 76, No. 13, Mar. 2000, 4 pages.
Melpignano et al., "Efficient light extraction and beam shaping from flexible, optically integrated organic light-emitting diodes," Appl. Phys. Lett., vol. 88, 2006, 4 pages.
Nakamura et al., "Thin-film waveguiding mode light extraction in organic electroluminescent device using high refractive index substrate," J. Appl. Phys., vol. 97, 2005, 7 pages.
Extended European Search Report for corresponding European Application No. 18210553.6, dated Apr. 10, 2019, 8 pages.

* cited by examiner

DISPLAY DEVICE AND METHOD OF MANUFACTURING THE SAME

CROSS-REFERENCE TO RELATED APPLICATION

This application claims priority to and the benefit of Korean Patent Application No. 10-2017-0165959, filed on Dec. 5, 2017, the entire content of which is hereby incorporated by reference.

BACKGROUND

1. Field

The subject matter of the present disclosure relates to a display device and a method of manufacturing the same.

2. Description of the Related Art

With the development of multimedia, display devices are becoming increasingly important. Accordingly, various types or kinds of display devices such as liquid crystal displays (LCDs) and organic light emitting displays (OLEDs) are being used.

Of these display devices, OLEDs display an image using an organic light emitting element that generates light through recombination of electrons and holes. Such OLEDs have the features of fast response speed, high luminance, wide viewing angle, and low power consumption.

In addition, LCDs are one of the most widely used types or kinds of flat panel displays. An LCD includes a pair of substrates having field generating electrodes, such as pixel electrodes and a common electrode, and a liquid crystal layer interposed between the two substrates. The LCD displays images by applying voltages to the field generating electrodes to generate an electric field in the liquid crystal layer, which determines orientations of liquid crystal molecules in the liquid crystal layer to adjust polarization of incident light.

As one way to allow each pixel to uniquely represent a primary color, a light conversion pattern may be placed in each pixel on a light path extending from a light source to a viewer. For example, a color filter may realize a primary color by transmitting only a set or specific wavelength band of incident light.

SUMMARY

Aspects of embodiments of the present disclosure provide a display device capable of preventing or reducing total reflection in a window member and a method of manufacturing the display device.

Aspects of embodiments of the present disclosure also provide a display device capable of improving light efficiency and a method of manufacturing the display device.

However, aspects of embodiments of the present disclosure are not restricted to the one set forth herein. The above and other aspects of embodiments of the present disclosure will become more apparent to one of ordinary skill in the art to which the present disclosure pertains by referencing the detailed description of the present disclosure given below.

According to an aspect of embodiments of the present disclosure, there is provided a display device comprising: a display panel which comprises a plurality of display elements; a window member which is disposed on the display panel; and a plurality of first light conversion members which convert the path of light emitted from the display elements and whose cross sections are about 450 nm to about 950 nm in diameter, wherein the first light conversion members directly contact a surface of the window member.

According to another aspect of embodiments of the present disclosure, there is provided a display device comprising: a display panel which comprises a plurality of display elements; a window member which is disposed on the display panel; and a plurality of light conversion members which convert the path of light emitted from the display elements and directly contact a surface of the window member, wherein the light conversion members comprise at least one of a plurality of nanoparticles and a plurality of nanofibers.

According to another aspect of embodiments of the present disclosure, there is provided a method of manufacturing a display device, the method comprising: preparing a display device which comprises a window member; and forming a plurality of light conversion members by providing the light conversion members to a surface of the window member through an electrospray and/or electrospinning process, wherein the light conversion members directly contact the surface of the window member.

BRIEF DESCRIPTION OF THE DRAWINGS

These and/or other aspects of embodiments will become apparent and more readily appreciated from the following description of certain embodiments, taken in conjunction with the accompanying drawings in which.

DETAILED DESCRIPTION

Figure 1:
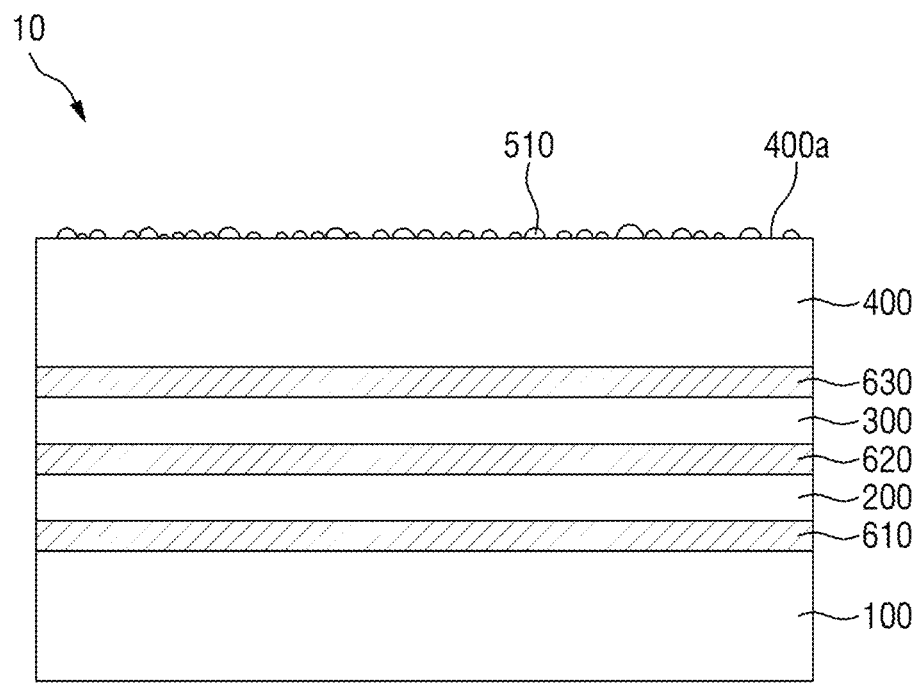
FIG. 1 is a cross-sectional view of a display device according to an embodiment.

In the following description, for the purposes of explanation, numerous details are set forth in order to provide a thorough understanding of various exemplary embodiments.

It is apparent, however, that various exemplary embodiments may be practiced without these particular details or with one or more equivalent arrangements. In other instances, existing structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded and/or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same or substantially the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments will be described with reference to the accompanying drawings.

FIG. 1 is a cross-sectional view of a display device 10 according to an embodiment.

Referring to FIG. 1, the display device 10 may include a display panel 100, an input sensing panel 200, an anti-reflection panel 300, and a window panel 400 (e.g., a window member). In the present specification, an element bonded to another element by an adhesive member will be expressed as a "panel." In addition, an element formed with another element through a continuous process will be expressed as a "layer." The panel includes a base layer that provides a base surface. On the other hand, the layer may not have the base layer. For example, when an element is expressed as a "layer," it is disposed on the base surface provided by another element. Here, the base layer may include a synthetic resin film, a composite film, and a glass substrate in an embodiment.

The display panel 100 is defined as a panel that displays an image. To display an image, the display panel 100 may include a plurality of display elements. The type or kind of the display panel 100 may vary depending on the type or kind of the display elements. In an embodiment, when the display elements are organic light emitting elements, the display panel 100 may be an organic light emitting display panel. In addition, when the display panel 100 includes liquid crystals as the display elements and includes quantum dots that scatter light passing through the liquid crystals, it may be a quantum dot display panel. The display panel 100 may also be a liquid crystal display panel and/or a plasma display panel. The display panel 100 will hereinafter be described as an organic light emitting display panel including a plurality of organic light emitting elements.

The input sensing panel 200 may be disposed on the display panel 100. The input sensing panel 200 may be bonded to the display panel 100 by a first adhesive member 610. The input sensing panel 200 may obtain coordinate information from an external input, for example, a touch. For example, the input sensing panel 200 may be, in an embodiment, a touch panel for sensing a user's touch or a fingerprint sensing panel for obtaining fingerprint information of a user's finger. An input sensing method of the input sensing panel 200 is not particularly limited. For example, the input sensing panel 200 may sense an external input using a capacitive method, an electromagnetic induction method, or a pressure sensing method.

The anti-reflection panel 300 may be disposed on the input sensing panel 200. The anti-reflection panel 300 may be bonded to the input sensing panel 200 by a second adhesive member 620 in an embodiment. The anti-reflection panel 300 may reduce the reflectance of external light incident on a surface 400a of the window panel 400.

The anti-reflection panel 300 may include a retarder and a polarizer in an embodiment. The retarder may be of a film type or kind or a liquid crystal coating type or kind in an embodiment. In addition, the retarder may include a λ/2 retarder and/or a λ/4 retarder. The polarizer may be of a film type or kind or a liquid crystal coating type or kind in an embodiment. Here, the film type or kind may include a stretch-type or kind synthetic resin film. The liquid crystal coating type or kind may include liquid crystals arranged in a set or predetermined pattern. Each of the retarder and the polarizer may further include a protective film in an embodiment. The retarder and the polarizer themselves may be defined as a base layer of the anti-reflection panel 300.

In an embodiment, the anti-reflection panel 300 may include a color filter and a black matrix. Alternatively, or additionally, the anti-reflection panel 300 may be omitted or may swap places with the input sensing panel 200.

The window panel 400 may be disposed on the anti-reflection panel 300. The window panel 400 may be bonded to the anti-reflection panel 300 by a third adhesive member 630 in an embodiment. The window panel 400 may protect the display panel 100 from external interference. The window panel 400 may be made of a light-transmitting material. The window panel 400 may include flat and/or curved regions. At least one selected from the first through third adhesive members 610 through 630 can be omitted. If an adhesive member is omitted, an element bonded to another element by the adhesive member may be expressed as a "layer" including a base layer instead of a "panel." For example, although the window panel 400 is described as a panel in FIG. 1, it can be expressed as a window layer.

The window panel 400 may include the surface 400a that is opposite a surface 400b facing the display panel 100. The surface 400a of the window panel 400 is defined as a surface that contacts the outside, for example, an air layer. A refractive index of the window panel 400 may be higher than a refractive index (about 1) of the air layer. In an embodiment, the refractive index of the window panel 400 may be about 1.5.

A plurality of light conversion members may convert the path of received light. The light conversion members may be made of a nanomaterial. Here, the nanomaterial may include at least one selected from light conversion particles 510 and light conversion fibers 550 (see FIG. 10). In addition, the light conversion members may be irregularly arranged on the surface 400a of the window panel 400. A case where the light conversion members include the light conversion particles 510 will first be described in more detail as an example.

The light conversion particles 510 may be disposed on the window panel 400. For example, the light conversion particles 510 may directly contact the surface 400a of the window panel 400.

The light conversion particles 510 may have diameters in nanometers in an embodiment. Here, the diameters of the light conversion particles 510 may be different from each other. The light conversion particles 510 may be irregularly arranged on the surface 400a of the window panel 400. The light conversion particles 510 will now be described in more detail with reference to FIGS. 2-4.

Figure 2:
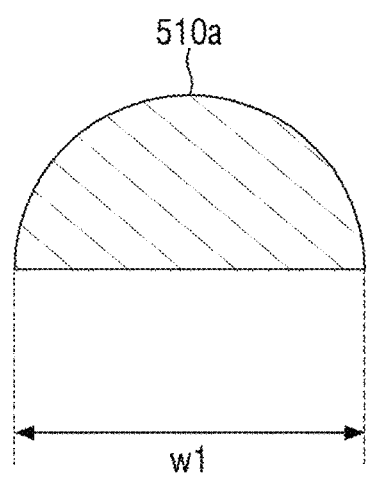
FIG. 2 illustrates a cross section of a light conversion particle.
Figure 3:
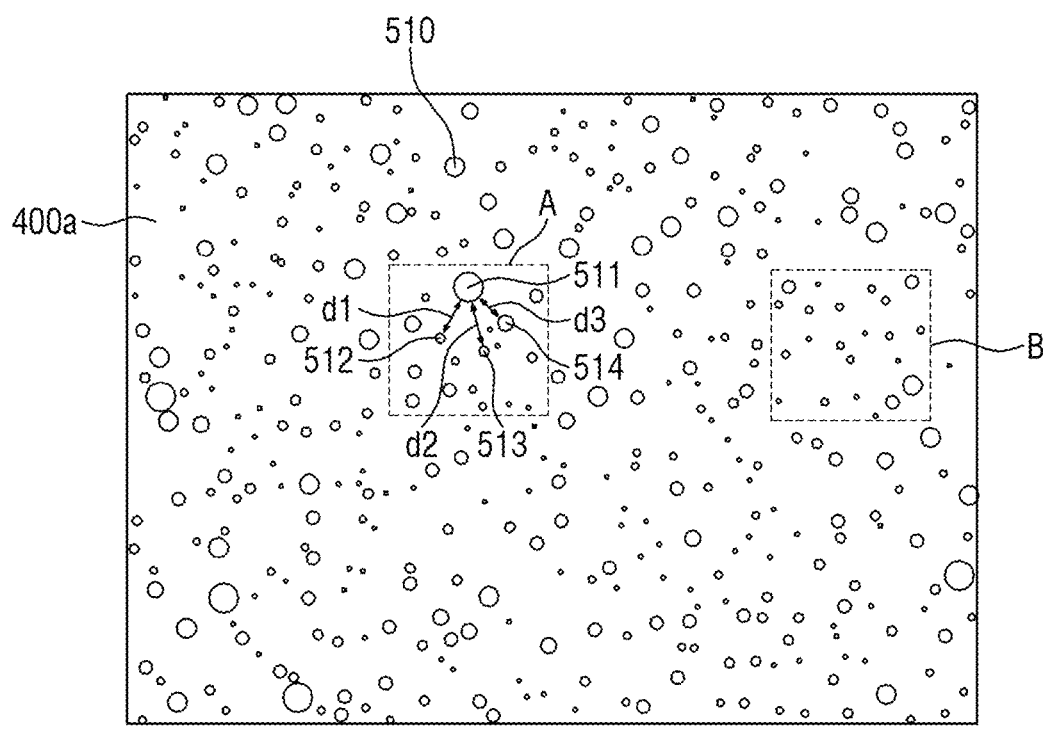
FIG. 3 is a plan view of a surface of a window panel and a plurality of light conversion particles disposed on the surface of the window panel.
Figure 4:
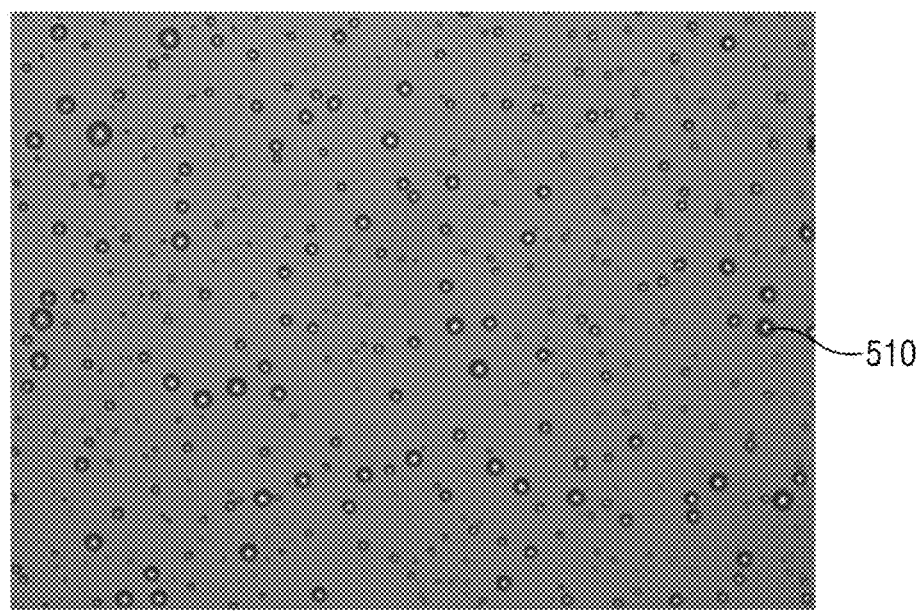
FIG. 4 is an enlarged view of the light conversion particles.

FIG. 2 illustrates a cross section 510a of a light conversion particle 510. FIG. 3 is a plan view of the surface 400a of the window panel 400 and the light conversion particles 510 disposed on the surface 400a of the window panel 400. FIG. 4 is an enlarged view of the light conversion particles 510.

The diameters, cross-sectional shape, refractive index and material of the light conversion particles 510 will be described first with reference to FIG. 2.

The light conversion particles 510 may be nanoparticles having diameters in nanometers. Here, the diameters of the light conversion particles 510 are not particularly limited as long as they are in the range of about 450 nm to about 950 nm. In an embodiment, the diameters of the light conversion particles 510 may be substantially the same as a wavelength region of blue light. The wavelength of blue light is about 450 nm to about 495 nm. For example, the diameters of the light conversion particles 510 may be about 450 nm to about 495 nm. Thus, light provided to the light conversion particles 510 can be prevented from being scattered (or a likelihood or amount of such scattering may be reduced).

The diameter of each of the light conversion particles 510 is defined based on the cross section 510a of the light conversion particle 510. Referring to FIG. 2, the cross section 510a of the light conversion particle 510 may have a hemispherical (e.g., substantially hemispherical) shape. As used herein, the term "hemispherical shape" includes not only a substantially hemispherical shape but also a shape substantially close to a hemisphere in consideration of process conditions and the like. A diameter w1 of the cross section 510a of the light conversion particle 510 may be about 450 nm to about 950 nm.

The refractive index of the light conversion particles 510 may be similar to the refractive index of the window panel 400 in an embodiment. Since the refractive index of the window panel 400 is about 1.5 as described above, the refractive index of the light conversion particles 510 may be about 1.45 to about 1.55 in an embodiment. Thus, the light conversion particles 510 can convert the path of light emitted from the display elements, thereby preventing or reducing total reflection that may occur in the window panel 400. This will be described in more detail herein below.

The type or kind of the light conversion particles 510 is not particularly limited as long as the light conversion particles 510 can prevent or reduce the total reflection that may occur in the window panel 400. For example, the light conversion particles 510 may be a material that has a refractive index of about 1.45 to about 1.55 and that can be cured by light and/or heat.

For example, the light conversion particles 510 may include a polymer, a photoinitiator, a thermal initiator, and a crosslinking agent. Here, the polymer may be an acryl-based and/or vinyl-based polymer. In addition, the light conversion particles 510 may include a metal and/or an organic/inorganic additive to improve the mechanical strength of the light conversion particles 510 and/or to improve the adhesion of the light conversion particles 510 to the window panel 400.

The inorganic additive may be titanium oxide/titanium dioxide ($TiO_2$), silicon nitride ($SiN_x$), silicon oxide ($SiO_x$), silica ($SiO_2$), and/or silver particles in an embodiment. In addition, the organic additive may include at least one selected from an amine group, a carboxyl group, and a siloxane group in an embodiment.

Next, the arrangement of the light conversion particles 510 will be described with reference to FIGS. 3-4.

The light conversion particles 510 may directly contact the surface 410a of the window panel 400. In an embodiment, the light conversion particles 510 may be arranged to cover at least part of the surface 410a of the window panel 400. In an embodiment, the light conversion particles 510 may be arranged to cover the entire (e.g., substantially the entire) surface 410a of the window panel 400.

The light conversion particles 510 may be irregularly arranged on the surface 410a of the window panel 400. Here, "when the light conversion particles 510 are irregularly arranged," they may be randomly arranged in all directions at no particular intervals. This will be described in more detail using an example based on FIG. 3.

The light conversion particles 510 may include first through fourth light conversion particles 511 through 514 disposed in a first region A of FIG. 3. A shortest distance d1 between the first light conversion particle 511 and the second light conversion particle 512, a shortest distance d2 between the first light conversion particle 511 and the third light conversion particle 513, and a shortest distance d3 between the first light conversion particle 511 and the fourth light conversion particle 514 may all be different from each other. For example, the light conversion particles 510 may be separated by different distances in a region. The different distances can be expressed as irregular intervals.

In addition, the arrangement, number and diameters of the light conversion particles 510 may be different even between regions having the same or substantially the same area. For example, the arrangement and number of light conversion particles 510 disposed in the first region A may be different from those of light conversion particles 510 disposed in the second region B. In addition, the diameters of the light conversion particles 510 disposed in the first region A may be different from those of the light conversion particles 510 disposed in the second region B. Here, the areas of the first region A and the second region B are defined as being the same or substantially the same. In other words, the arrangement, number and diameters of the light conversion particles 510 in any two regions of the surface 410a of the window panel 400 may be different.

For example, when the light conversion particles 510 are irregularly arranged, the intervals between the light conversion particles 510 may be random, and the diameters of the light conversion particles 510 may be random. Accordingly, this can prevent the light conversion particles 510 from functioning as a diffraction grating (or reduce a likelihood or amount of the light conversion particles 510 functioning as a diffraction grating), thereby preventing light of a set or specific wavelength region from being relatively strongly emitted to the outside (or thereby reducing a likelihood or amount of such light emission).

The prevention or reduction of total reflection in the light conversion particles 510 and the window panel 400 will now be described in more detail with reference to FIG. 5.

Figure 5:
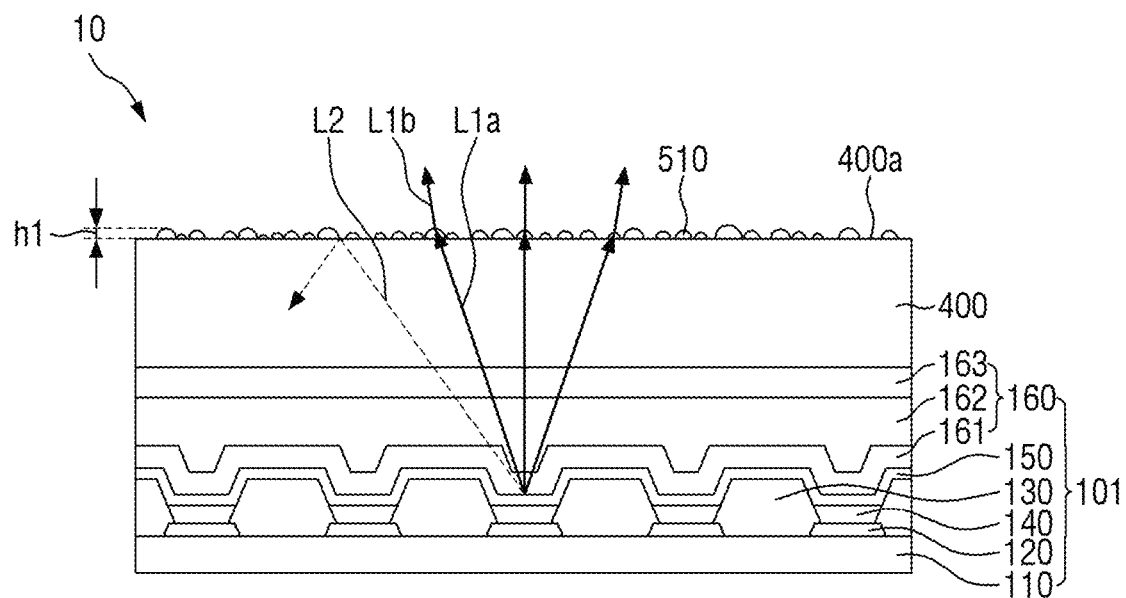
FIG. 5 illustrates prevention or reduction of total reflection in the display device according to the embodiment of FIG. 1.

FIG. 5 illustrates prevention or reduction of total reflection in the display device 10 according to the embodiment of FIG. 1. In FIG. 5, for convenience, the description will be made based on the display panel 100 and the window panel 400 illustrated in FIG. 1. In addition, in FIG. 5, an organic light emitting display panel 101 will be described as an embodiment of the display panel 100 illustrated in FIG. 1.

Referring to FIG. 5, the organic light emitting display panel 101 may include a substrate 110, a plurality of pixel electrodes 120, a pixel defining layer 130, a plurality of organic light emitting layers 140, a common electrode 150, and an encapsulation layer 160.

The substrate 110 may be an insulating substrate. In an embodiment, the substrate 110 may include a material such as glass, quartz, and/or polymer resin. Here, the polymer material may be polyethersulphone (PES), polyacrylate (PA), polyarylate (PAR), polyetherimide (PEI), polyethylene naphthalate (PEN), polyethylene terepthalate (PET), polyphenylene sulfide (PPS), polyallylate, polyimide (PI), polycarbonate (PC), cellulose triacetate (CAT), cellulose acetate propionate (CAP), or a combination of these materials. In an embodiment, the substrate 110 may be a flexible substrate containing polyimide (PI).

The pixel electrodes 120 may be disposed on the substrate 110. A plurality of elements may further be disposed between the substrate 110 and the pixel electrodes 120. In an embodiment, the elements may include a buffer layer, a plurality of conductive wirings, an insulating layer, and a plurality of thin-film transistors. Here, the thin-film transistors may use amorphous silicon, polysilicon, low temperature polysilicon (LTPS), an oxide semiconductor, and/or an organic semiconductor as channel layers. The types or kinds of the respective channel layers of the thin-film transistors may be different from each other. In an embodiment, both a thin-film transistor including an oxide semiconductor and a thin-film transistor including low temperature polysilicon (LTPS) may be formed in one pixel in consideration of the roles of the thin-film transistors and/or the process sequence.

The pixel electrodes 120 may be anodes in an embodiment. When the pixel electrodes 120 are anodes, they may be transparent electrodes or translucent electrodes or may be made of a reflective material such as aluminum, silver, chromium or an alloy of these materials. The transparent or translucent electrodes may be made of one or more selected from indium tin oxide (ITO), indium zinc oxide (IZO), zinc oxide (ZnO), indium oxide ($In_2O_3$), indium gallium oxide (IGO) and aluminum zinc oxide (AZO). The reflective material may include, in an embodiment, one or more selected from silver (Ag), magnesium (Mg), chromium (Cr), gold (Au), platinum (Pt), nickel (Ni), copper (Cu), tungsten (W), and aluminum (Al).

Each of the pixel electrodes 120 may be formed as a single film in an embodiment. Alternatively, or additionally, each of the pixel electrodes 120 may be formed as a multi-film in which two or more materials are stacked.

When formed as a multi-film, each of the pixel electrodes 120 may include, in an embodiment, a reflective film and a transparent or translucent electrode disposed on the reflective film. In an embodiment, each of the pixel electrodes 120 may include a reflective film and a transparent or translucent electrode disposed under the reflective film. For example, each of the pixel electrodes 120 may have a three-layer structure of ITO/Ag/ITO.

The pixel defining layer 130 may be disposed on the pixel electrodes 120. The pixel defining layer 130 includes a plurality of openings that at least partially expose the pixel electrodes 120. The pixel defining layer 130 may include an organic material and/or an inorganic material. In an embodiment, the pixel defining layer 130 may include a material such as photoresist, polyimide resin, acrylic resin, a silicon compound, and/or polyacrylic resin.

The organic light emitting layers 140 may be disposed on the pixel electrodes 120 and the pixel defining layer 130. For example, the organic light emitting layers 140 may be disposed on regions of the pixel electrodes 120 exposed through the openings of the pixel defining layer 130. The organic light emitting layers 140 may at least partially cover sidewalls of the pixel defining layer 130 in an embodiment.

In an embodiment, the organic light emitting layers 140 may emit light of one selected from red, blue and green colors. In an embodiment, the organic light emitting layers 140 may emit white light or emit light of one selected from cyan, magenta and yellow colors. When the organic light emitting layers 140 emit white light, they may include a white light emitting material or may have a stack of a red light emitting layer, a green light emitting layer and a blue light emitting layer. In the present specification, a front emission type or kind in which light emitted from the organic light emitting layers 140 is provided in an upward direction is described as an example based on FIG. 5. However, a bottom emission type or kind or a double side emission can also be employed.

The common electrode 150 may be disposed on the organic light emitting layers 140 and the pixel defining layer 130. The common electrode 150 may be formed over the organic light emitting layers 140 and the pixel defining layer 130 in an embodiment. The common electrode 150 may be a cathode in an embodiment. In an embodiment, the common electrode 150 may include one or more selected from Li, Ca, LiF/Ca, LiF/Al, Al, Ag, and Mg. In addition, the common electrode 150 may be made of a material having a low work function. The common electrode 150 may be, in an embodiment, a transparent or translucent electrode including any one or more selected from indium tin oxide (ITO), indium zinc oxide (IZO), zinc oxide (ZnO), indium oxide ($In_2O_3$), indium gallium oxide (IGO), and aluminum zinc oxide (AZO).

The pixel electrodes 120, the organic light emitting layers 140 and the common electrode 150 described above may constitute an organic light emitting element OLED, but embodiments are not limited to this case. The organic light emitting device OLED may be a multilayer structure further including a hole injection layer (HIL), a hole transport layer (HTL), an electron transport layer (ETL), and an electron injection layer (EIL).

The encapsulation layer 160 may be disposed opposite the substrate 110 and cover the organic light emitting element OLED. The encapsulation layer 160 may prevent moisture and/or air that can be introduced from the outside from penetrating the organic light emitting element OLED (or may reduce a likelihood or amount of such moisture and/or air penetration). In an embodiment, the encapsulation layer 160 may include a first inorganic layer 161, an organic layer 162, and a second inorganic layer 163.

The first inorganic layer 161 may be disposed on the common electrode 150. The first inorganic layer 161 may include any one or more selected from silicon oxide (SiOx), silicon nitride (SiNx), and silicon oxynitride (SiONx).

The organic layer 162 may be disposed on the first inorganic layer 161. The organic layer 162 may include any one or more selected from epoxy, acrylate, and urethane acrylate. The organic layer 162 may planarize a step formed by the pixel defining layer 130.

The second inorganic layer 163 may be disposed on the organic layer 162. The second inorganic layer 163 may include any one or more selected from silicon oxide (SiOx), silicon nitride (SiNx), and silicon oxynitride (SiONx).

In FIG. 5, each of the first inorganic layer 161, the organic layer 162, and the second inorganic layer 163 is illustrated as a monolayer. However, embodiments are not limited to this case. For example, at least one selected from the first inorganic layer 161, the organic layer 162, and the second inorganic layer 163 may be formed in a multilayer structure.

In an embodiment, the encapsulation layer 160 may include a hexamethyldisiloxane (HMDSO) layer. For example, the encapsulation layer 160 may include a first inorganic layer 161, a second inorganic layer 163, and an HMDSO layer disposed between the first inorganic layer 161 and the second inorganic layer 163. In some embodiments, the above-described organic layer 162 can be replaced with the HMDSO layer.

In an embodiment, the HMDSO layer may be formed after the formation of the first inorganic layer 161 in the same chamber in which the first inorganic layer 161 was formed. Thus, the process of forming the encapsulation layer 160 can be simplified. In addition, the encapsulation layer 160 can have sufficient flexibility by including an HMDSO layer that can absorb stress.

Alternatively, or additionally, the encapsulation layer 160 may be a transparent insulating substrate. Here, the transparent insulating substrate may be a glass substrate, a quartz substrate, a transparent resin substrate, and/or the like. When the encapsulation layer 160 is a transparent insulating substrate, it may be bonded to the substrate 110 by a sealing member.

The light conversion particles 510 may be disposed on the surface 400a of the window panel 400. Here, assuming that the light conversion particles 510 form a layer, the layer may be a monolayer. In addition, a maximum value of a height h1 of the monolayer is equal to the diameter of a largest light conversion particle among the light conversion particles 510. Accordingly, the height h1 of the monolayer may be about 950 nm or less.

The light conversion particles 510 may receive light from the organic light emitting layers 140 and convert the path of the light. This will be described in more detail herein below. In FIG. 5, the fact that light is refracted by the refractive index of another element such as the encapsulation layer 160 will not be taken into consideration.

Light emitted from one of the organic light emitting layers 140 may be provided to the light conversion particles 510. The light emitted from one of the organic light emitting layers 140 will hereinafter be referred to as first light L1a. Here, the term "first" is just an identifier used to distinguish the first light L1a from second light L2 and third light L1b which will be described later.

As described above, the refractive index of the light conversion particles 510 is similar to the refractive index of the window panel 400. Therefore, the first light L1a is not totally reflected at the surface 400a of the window panel 400 but is provided to the outside via the light conversion particles 510.

If the difference between the refractive index of the light conversion particles 510 and the refractive index of the window panel 400 is large (enough to cause total reflection) and/or if the light conversion particles 510 are not present, the first light L1a may be, like the second light L2, totally reflected back toward the organic light emitting layers 140 by the difference in refractive index between the surface 400a of the window panel 400a and the air layer.

However, since the light conversion particles 510 having a refractive index similar to that of the window panel 400 are formed on the surface 400a of the window panel 400 in the display device 10 according to the embodiment, the first light L1a passes through the surface 400a of the window panel 400 to be provided to the light conversion particles 510. For example, the first light L1a is not totally reflected at the surface 400a of the window panel 400. The light provided to the light conversion particles 510 will hereinafter be referred to as the third light L1b. The third light L1b may be emitted to the outside through the light conversion particles 510 without being totally reflected at the surface 400a of the window panel 400. However, the third light L1b may be refracted at an angle corresponding to the difference in refractive index between the light converting particles 510 and the air layer.

For example, the first light L1a emitted from the organic light emitting layers 140 is not totally reflected like the second light L2 but is emitted to the outside like the third light L1b. Thus, the light efficiency of the display device 10 according to the embodiment can be improved. In addition, since the light conversion particles 510 are irregularly arranged, they can be prevented from functioning as a diffraction grating (or a likelihood or amount of them functioning as a diffraction grating may be reduced). Further, since the light conversion particles 510 are formed in nanometers, light provided to the light conversion particles 510 can be prevented from being scattered (or a likelihood or amount of such scattering may be reduced).

Next, a method of forming the light conversion particles 510 will be described in more detail with reference to FIG. 6.

Figure 6:
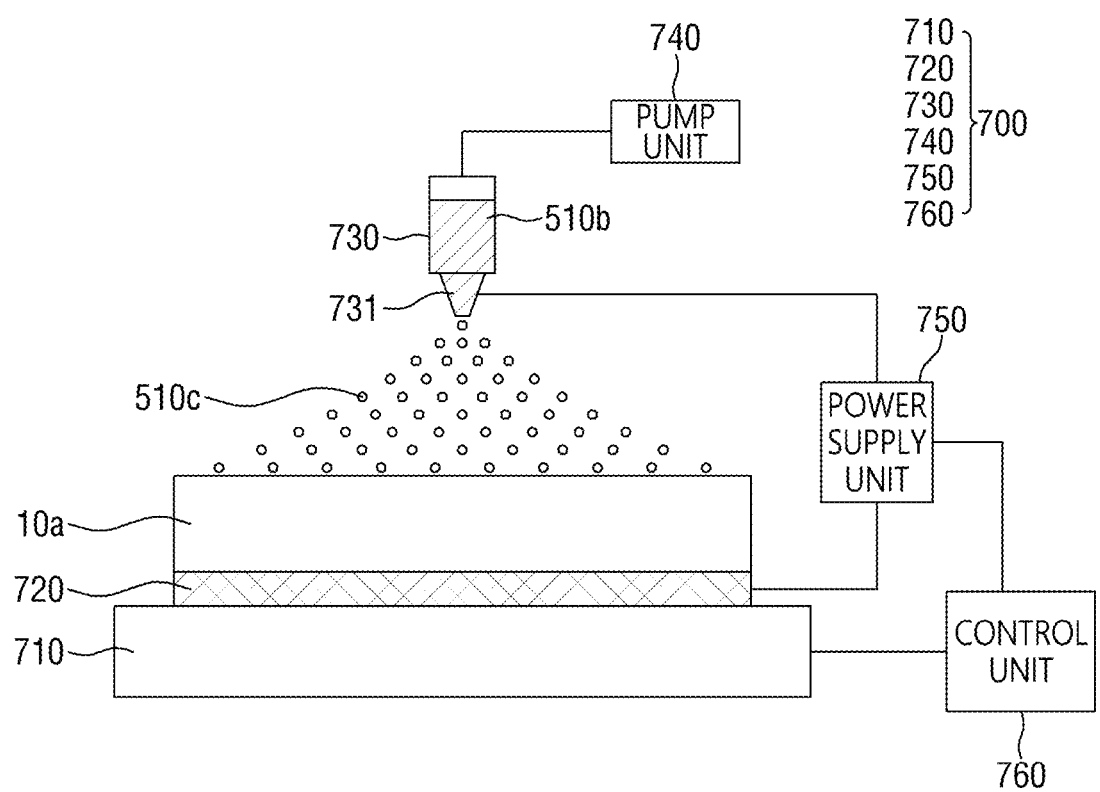
FIG. 6 illustrates a method of manufacturing the display device according to the embodiment of FIG. 1.

FIG. 6 illustrates a method of manufacturing the display device 10 according to the embodiment of FIG. 1.

In FIG. 6, a display device in which the light conversion particles 510 have not been formed will be referred to as a preliminary display device 10a. In addition, in FIG. 6, the input sensing panel 200 and the anti-reflection panel 300 illustrated in FIG. 1 are omitted for ease of description.

Referring to FIG. 6, the light conversion particles 510 may be formed on the surface 400a of the window panel 400 of the preliminary display device 10a by an electrospray process. This will be described in more detail herein below.

An electrospray device 700 may include a stage 710, a support 720, a spray unit 730, a pump unit 740, a power supply unit 750, and a control unit 760.

The preliminary display device 10a may be placed on the stage 710. For example, the preliminary display device 10a may be placed on the support 720 disposed on the stage 710. The stage 710 can move or tilt the preliminary display device 10a under the control of the control unit 760.

The support 720 may be disposed on the stage 710 and may support the preliminary display device 10a. The support 720 may be made of a conductive material and may be electrically connected to the power supply unit 750.

The spray unit 730 may hold a light conversion solution 510b to spray the light conversion particles 510 onto the preliminary display device 10a placed on the support 720. Here, the light conversion solution 510b may have a viscosity of about 50 cp or less.

The spray unit 730 may be placed to face the preliminary display device 10a placed on the support 720. The spray unit 730 may include a nozzle unit 731 to evenly spray the light conversion solution 510b onto the preliminary display device 10a. In an embodiment, the nozzle unit 731 may be made of a conductive material and may be electrically connected to the power supply unit 750.

The spray unit 730 may be connected to the pump unit 740. The pump unit 740 may apply pressure to the light conversion solution 510b contained in the spraying unit 730 to position the light conversion solution 510b at an end of the nozzle unit 731.

The power supply unit 750 may apply a driving voltage to the support 720 and the nozzle unit 731. When the driving voltage is applied, an electric field is generated between the support 720 and the nozzle unit 731. Here, the level of the driving voltage may determine the diameters of the light conversion particles 510 formed on the surface 400a of the window panel 400. The level of the driving voltage is not particularly limited as long as the light conversion particles 510 can be formed to diameters of about 450 nm to about 950 nm. In an embodiment, the driving voltage may be about 1 kV to about 40 kV.

The light conversion solution 510b sprayed through the nozzle unit 731 of the spray unit 730 will hereinafter be referred to as a light conversion material 510c. The light conversion material 510c may be sprayed onto the surface 400a of the window panel 400 by the above electric field. The light conversion material 510c may be circular (e.g., substantially circular) in an embodiment. The light conversion material 510c is sprayed onto the surface 400a of the window panel 400 to form the light conversion particles 510. Here, the light conversion materials 510c may be deformed into a hemispherical (e.g., substantially hemispherical) shape as they collide with the surface 400a of the window panel 400. Accordingly, the light conversion particles 510 may be hemispherical (e.g., substantially hemispherical).

In FIG. 6, the preliminary display device 10a is placed on the support 720. However, embodiments are not limited to this case. For example, only the window panel 400 can be placed on the support 720, or a window panel or a display device in the form of a motherboard can be placed on the support 720.

Hereinafter, display devices according to other embodiments will be described. For simplicity, a redundant description of elements and features identical to those described above with reference to FIGS. 1-6 will be omitted.

Figure 7:
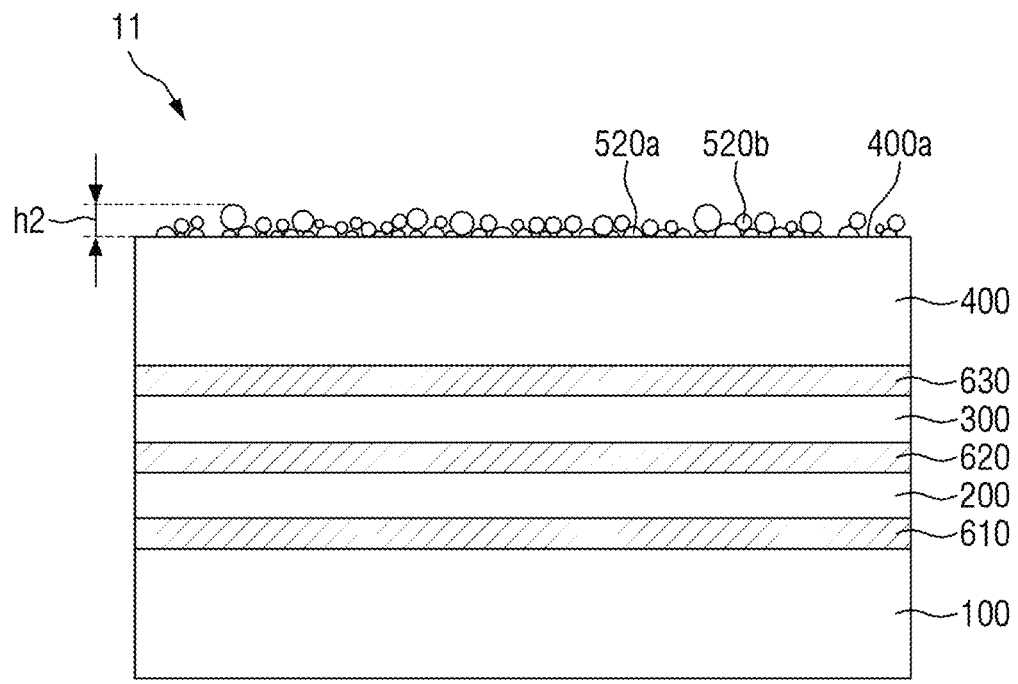
FIG. 7 is a cross-sectional view of a display device according to an embodiment.

FIG. 7 is a cross-sectional view of a display device 11 according to an embodiment.

Referring to FIG. 7, the display device 11 may include a plurality of first light conversion particles 520a and a plurality of second light conversion particles 520b sequentially stacked on a surface 400a of a window panel 400.

For example, the second light conversion particles 520b may be disposed on the first light conversion particles 520a. The first light conversion particles 520a may be hemispherical (e.g., substantially hemispherical) in shape, and the second light conversion particles 520b may be circular (e.g., substantially circular) in shape.

For example, the first light conversion particles 520a which contact the window panel 400 relatively earlier may be deformed into a hemispherical (e.g., substantially hemispherical) shape as they collide with the surface 400a of the window panel 400. On the other hand, the second light conversion particles 520b may maintain their circular (e.g., substantially circular) shape because they collide with the first light conversion particles 520a instead of the surface 400a of the window panel 400.

Assuming that the first light conversion particles 520a and the second light conversion particles 520b form a layer, the display device 11 of FIG. 7 is different from the display device 10 of FIG. 1 in that the first light conversion particles 520a and the second light conversion particles 520b form a multilayer. A height h2 of the multilayer may be about 20 μm or less in an embodiment.

Not all of the first light conversion particles 520a may be hemispherical (e.g., substantially hemispherical), and circular (e.g., substantially circular) and hemispherical (e.g., substantially hemispherical) first light conversion particles 520a may coexist. In addition, not all of the second light conversion particles 520b may be circular (e.g., substantially circular), and circular (e.g., substantially circular) and hemispherical (e.g., substantially hemispherical) second light conversion particles 520b may coexist.

Figure 8:
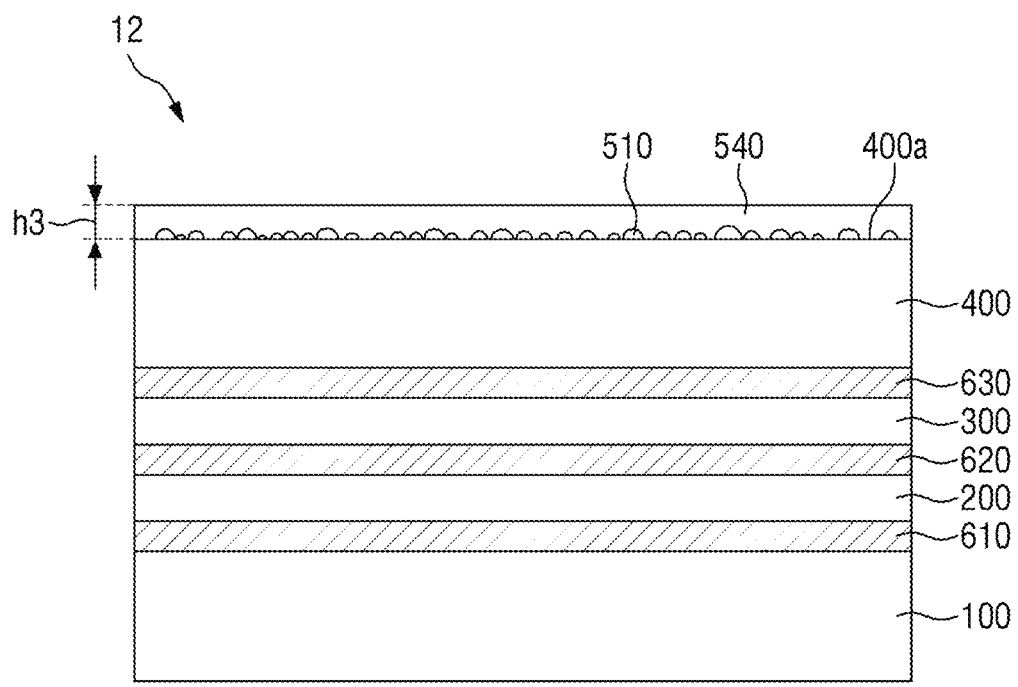
FIG. 8 is a cross-sectional view of a display device according to an embodiment.

FIG. 8 is a cross-sectional view of a display device 12 according to an embodiment.

Referring to FIG. 8, the display device 12 may further include a protective layer 540 disposed on a plurality of light conversion particles 510.

The protective layer 540 may cover the light conversion particles 510. For example, the protective layer 540 may prevent the light conversion particles 510 from being detached from a surface 400a of a window panel 400 (or may reduce a likelihood or amount of such detachment) or protect the light conversion particles 510 from external impacts or foreign matter.

A refractive index of the protective layer 540 may be similar to that of the window panel 400. The refractive index of the protective layer 540 may be about 1.45 to about 1.55 in an embodiment. The material of the protective layer 540 is not particularly limited as long as its refractive index is similar to that of the window panel 400 so as to reduce the occurrence of total reflection in the window panel 400. In an embodiment, the protective layer 540 may be formed as an organic film and/or an inorganic film.

A height h3 of the protective layer 540 is not particularly limited as long as the protective layer 540 can cover the light conversion particles 510. In an embodiment, the height h3 of the protective layer 540 may be about 20 μm or less.

Figure 9:
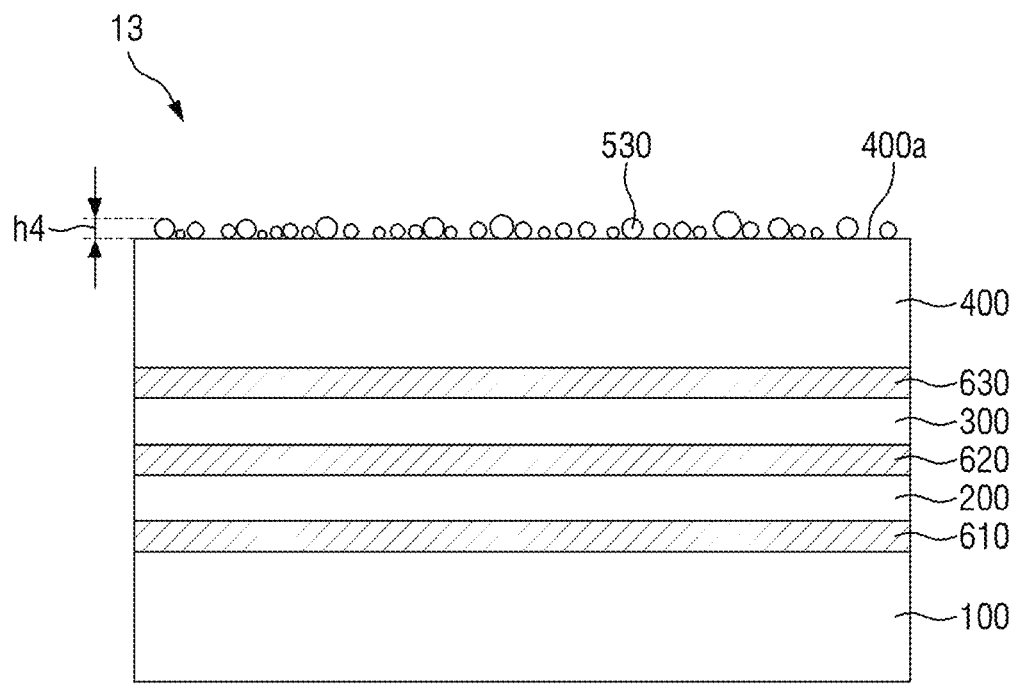
FIG. 9 is a cross-sectional view of a display device according to an embodiment.

FIG. 9 is a cross-sectional view of a display device 13 according to an embodiment.

Referring to FIG. 9, the display device 13 may include a plurality of light conversion particles 530 having a circular (e.g., substantially circular) shape. For example, the light conversion particles 530 may have a circular (e.g., substantially circular) cross-sectional shape. As used herein, the term "circular shape" includes not only a substantially circular shape but also a shape (e.g., an ellipse or a polygon) substantially close to a circle in consideration of process conditions and the like.

Assuming that cross sections 530a of the light conversion particles 530 are all circular (e.g., substantially circular) and the circular (e.g., substantially circular) light conversion particles 530 form a layer, a maximum height h4 of the layer may be about 450 nm to about 500 nm which is half the maximum diameter (about 950 nm).

Figure 10:
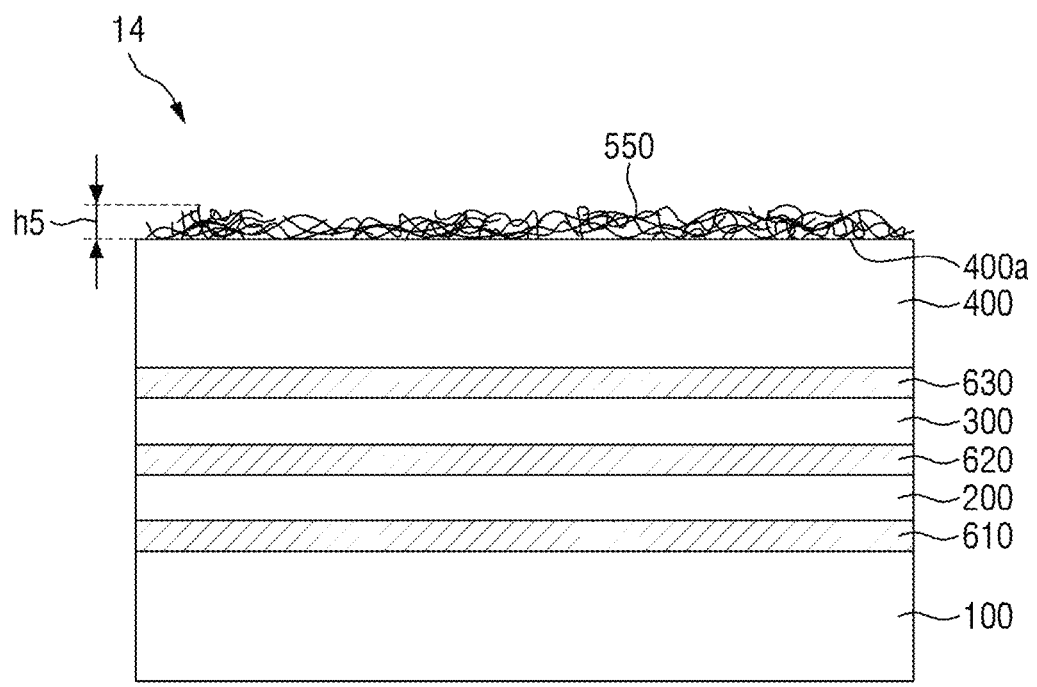
FIG. 10 is a cross-sectional view of a display device according to an embodiment.
Figure 11:
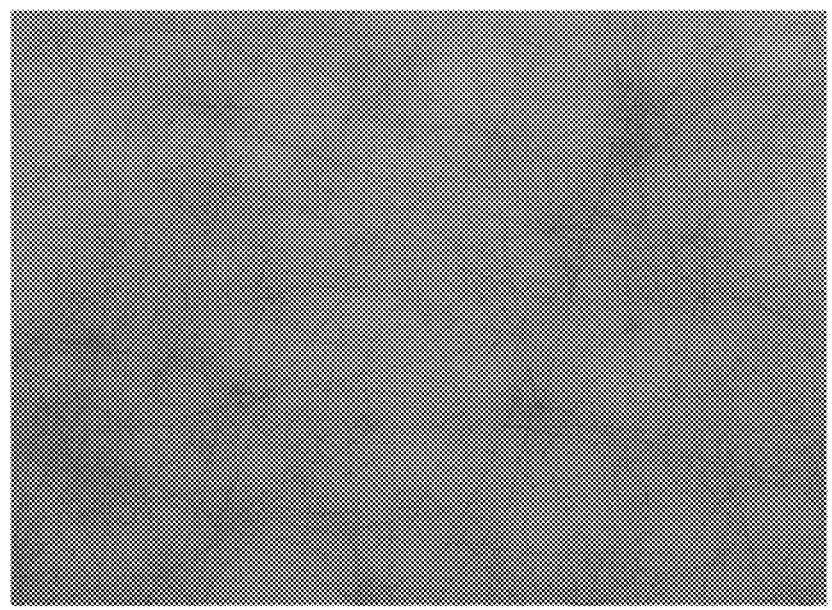
FIG. 11 shows the planar shape of light conversion fibers illustrated in FIG. 10.
Figure 12:
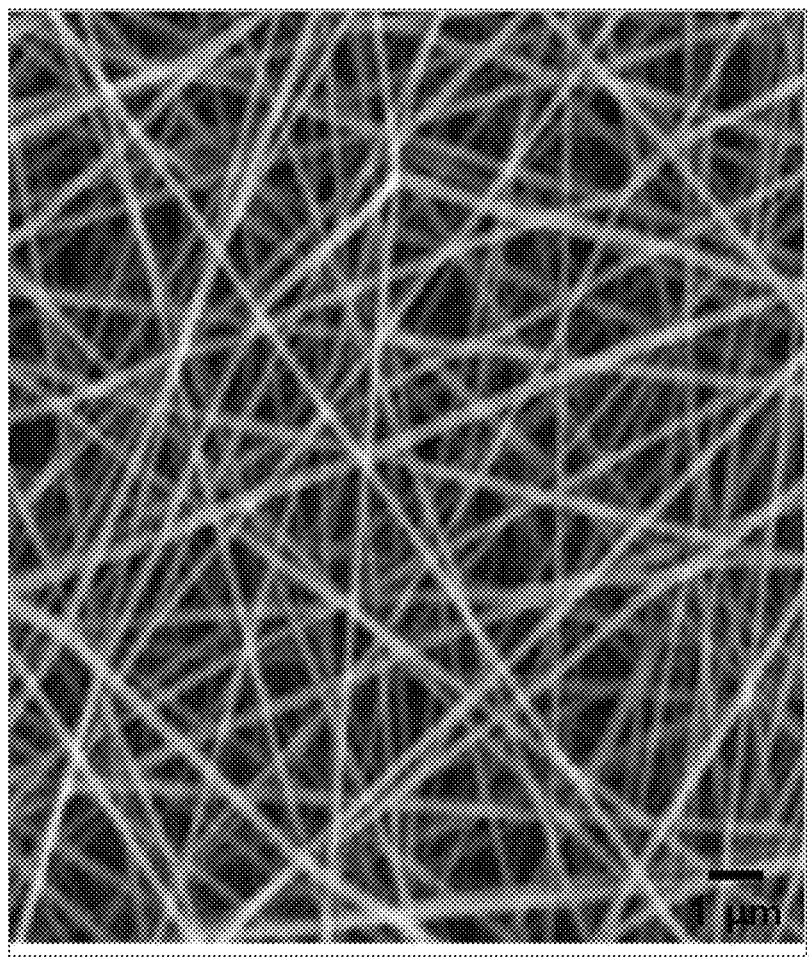
FIG. 12 is an enlarged view of the light conversion fibers.
Figure 13:
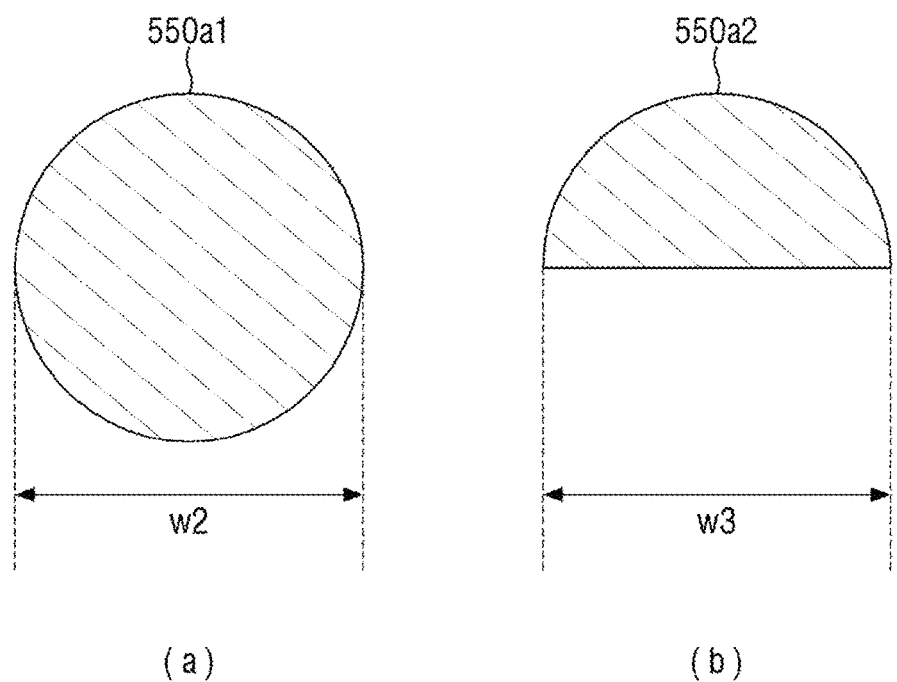
FIG. 13 illustrates embodiments of cross sections of the light conversion fibers illustrated in FIG. 10.

FIG. 10 is a cross-sectional view of a display device 14 according to an embodiment. FIG. 11 shows the planar shape of light conversion fibers 550 illustrated in FIG. 10. FIG. 12 is an enlarged view of the light conversion fibers 550. FIG. 13 illustrates embodiments of cross sections of the light conversion fibers 550 illustrated in FIG. 10.

The display device 14 of FIGS. 10-13 is different from the display device 10 of FIG. 1 in that it includes a plurality of light conversion fibers 550 instead of the light conversion particles 510.

Referring to FIGS. 10-12, the light conversion fibers 550 may be disposed on a window panel 400. For example, the light conversion fibers 550 may directly contact a surface 400a of the window panel 400.

The light conversion fibers 550 may be irregularly arranged on the surface 400a of the window panel 400. In an embodiment, the light conversion fibers 550 may be arranged to cover at least part of the surface 400a of the window panel 400. However, in an embodiment, the light conversion fibers 550 may be arranged to cover the entire (e.g., substantially the entire) surface 400a of the window panel 400.

Assuming that the light conversion fibers 550 form a layer, a maximum value of a height h5 of the layer may be about 20 μm or less.

A refractive index of the light conversion fibers 550 may be similar to that of the window panel 400 in an embodiment. Since the refractive index of the window panel 400 is about 1.5 as described above, the refractive index of the light conversion fibers 550 may be about 1.45 to about 1.55 in an embodiment. Thus, the light conversion fibers 550 can convert the path of light emitted from a plurality of display elements, thereby preventing or reducing total reflection that may occur in the window panel 400.

The type or kind of the light conversion fibers 550 is not particularly limited as long as the light conversion fibers 550 can prevent or reduce the total reflection that may occur in the window panel 400. For example, the light conversion fibers 550 may be a material that has a refractive index of about 1.45 to about 1.55 and that can be cured by light and/or heat. Since the light conversion fibers 550 are made from a solution having a different viscosity from the solution used to form the light conversion particles 510 as described above, the material of the light conversion fibers 550 may be the same or substantially the same as the material of the light conversion particles 510.

Referring to FIG. 13, the light conversion fibers 550 may have diameters in nanometers in an embodiment. Here, the diameters of the light conversion fibers 550 may be different from each other. The diameters of the light conversion fibers 550 are defined based on cross sections 550a1 or 550a2 of the light conversion fibers 550. Referring to FIG. 13A, a cross sections 550a1 of a light conversion fiber 550 may have a circular (e.g., substantially circular) shape in an embodiment. As used herein, the term "circular shape" includes not only a circular shape but also a shape (e.g., an ellipse or a polygon) substantially close to a circle in consideration of process conditions and the like. In addition, referring to FIG. 13B, a cross section 550a2 of a light conversion fiber 550 may have a hemispherical (e.g., substantially hemispherical) shape in an embodiment. Diameters w2 and w3 of the cross sections 550a1 and 550a2 of the light conversion fibers 550 may be about 450 nm to about 950 nm.

In FIG. 13, the cross sections 550a1 and 550a2 of the light conversion fibers 550 are circular (e.g., substantially circular) and hemispherical (e.g., substantially hemispherical), but embodiments not limited to this case. For example, the light conversion fibers 550 can have one selected from a circular (e.g., substantially circular) cross-sectional shape and a hemispherical (e.g., substantially hemispherical) cross-sectional shape. Alternatively, or additionally, the light conversion fibers 550 can have a polygonal cross-sectional shape close to a circular (e.g., substantially circular) shape and a hemispherical (e.g., substantially hemispherical) shape.

In addition, light conversion members formed on the surface 400a of the window panel 400 can include both the light conversion particles 510 and the light conversion fibers 550.

Figure 14:
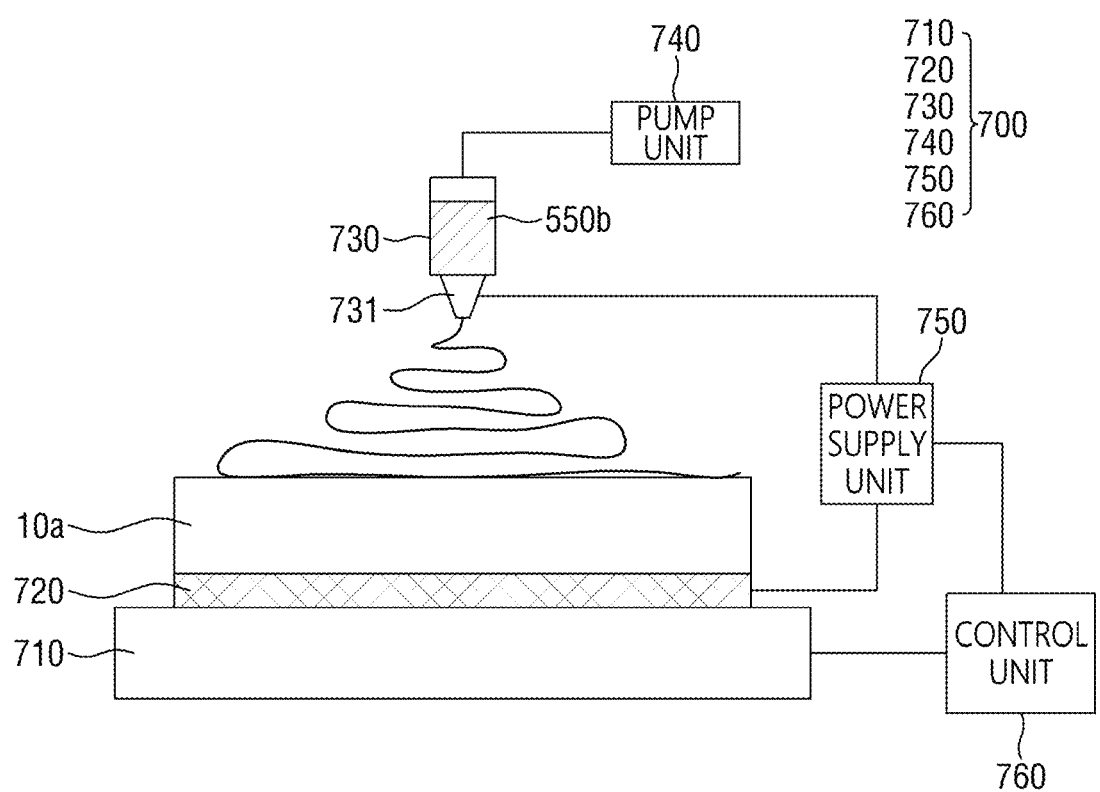
FIG. 14 illustrates a method of manufacturing the display device of FIG. 10.

FIG. 14 illustrates a method of manufacturing the display device 14 of FIG. 10. For simplicity, a redundant description of elements and features described above with reference to FIG. 6 will be omitted. In FIG. 14, a display device in which the light conversion fibers 550 have not been formed will be referred to as a preliminary display device 10a.

Referring to FIG. 14, the light conversion fibers 550 may be formed on the surface 400a of the window panel 400 of the preliminary display device 10a by an electrospinning process The light conversion fibers 550 may be provided on the surface 400a of the window panel 400 of the preliminary display device 10a by the same electrospray device 700 described above with reference to FIG. 6.

However, the viscosity of a light conversion solution 550b contained in the spray unit 730 of the electrospray device 700 may be higher than that of the light conversion solution 510b described above with reference to FIG. 6. In an embodiment, the viscosity of the light conversion solution 550b may be higher than about 50 cp. Accordingly, the light conversion solution 550b may be spun onto the preliminary display device 10a by the nozzle unit 731 to form the light conversion fibers 550.

For example, even if the materials contained in the two solutions are identical to each other, spraying and/or spinning may be determined according to the viscosity of a solution to form the light conversion particles 510 (see FIG. 1) and/or the light conversion fibers 550 (see FIG. 10).

Figure 15:
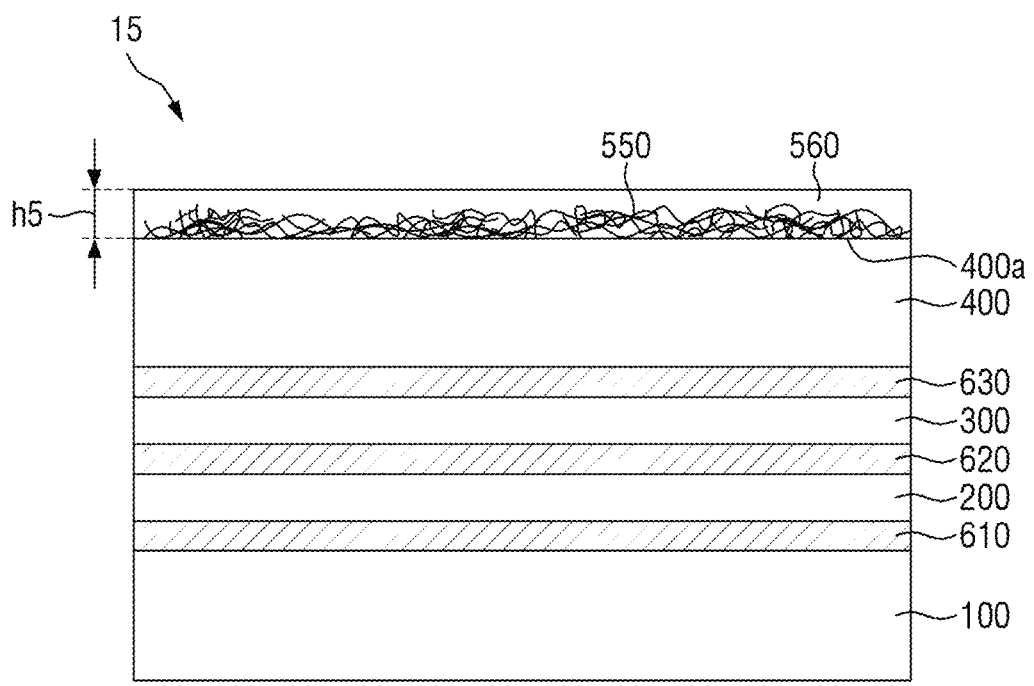
FIG. 15 is a cross-sectional view of an embodiment of the display device illustrated in FIG. 10.

FIG. 15 is a cross-sectional view of an embodiment of the display device illustrated in FIG. 10.

Referring to FIG. 15, a display device 15 may further include a protective layer 560 disposed on a plurality of light conversion fibers 550.

The protective layer 560 may cover the light conversion fibers 550. For example, the protective layer 560 may prevent or reduce the light conversion fibers 550 from being detached from a surface 400a of a window panel 400 or protect the light conversion fibers 550 from external impacts and/or foreign matter. The protective layer 560 illustrated in FIG. 15 is substantially the same as the protective layer 540 illustrated in FIG. 8 except that it covers the light conversion fibers 550, and thus further description thereof is not necessary here.

A display device and a method of manufacturing the same according to an embodiment can prevent or reduce total reflection in a window member.

In addition, light efficiency can be improved.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

However, the effects of the embodiments are not restricted to the ones set forth herein. The above and other effects of the embodiments will become more apparent to one of daily skill in the art to which the embodiments pertain by referencing the claims.

What is claimed is:

1. A display device comprising:
a display panel comprising a plurality of display elements;
a window member on the display panel, the window member including a first surface facing the display panel and a second surface opposite to the first surface; and
a plurality of first light conversion members that convert the path of light emitted from the display elements and having cross sections that are about 450 nm to about 950 nm in diameter,
a plurality of second light conversion members on the first light conversion members and having cross sections that are about 450 nm to about 950 nm in diameter,
wherein the first light conversion members directly contact the second surface of the window member, and
wherein the first light conversion members comprise nanoparticles,
wherein the nanoparticles of first light conversion members comprise a vinyl-based polymer,
wherein one of the plurality of first light conversion members directly contacts the second surface of the window member,
wherein one of the plurality of second light conversion members directly contacts the one of the plurality of first light conversion members,
wherein the one of the plurality of second light conversion members and the one of the plurality of first light conversion members overlap each other in a direction perpendicular to the second surface of the window member, and
wherein a cross-sectional shape of the one of the plurality of first light conversion members and a cross-sectional shape of the one of the plurality of second light conversion members are different for each other.

2. The display device of claim 1, wherein the first light conversion members are irregularly arranged on the surface of the window member.

3. The display device of claim 1, wherein the first light conversion members have a refractive index of about 1.45 to about 1.55.

4. The display device of claim 1, wherein the nanoparticles have hemispherical cross sections.

5. The display device of claim 1, wherein the second light conversion members have a circular shape.

6. The display device of claim 1, wherein the first light conversion members further comprise a photoinitiator, a thermal initiator, and a crosslinking agent.

7. The display device of claim 6, wherein the first light conversion members further comprise an inorganic additive comprising titanium oxide/titanium dioxide ($TiO_2$), silicon nitride ($SiN_x$), silicon oxide ($SiO_x$), silica ($SiO_2$) and/or silver particles, and/or an organic additive comprising at least one selected from an amine group, a carboxyl group and a siloxane group.

8. The display device of claim 7, further comprising a protective layer covering the first light conversion members.

9. The display device of claim 8, wherein the protective layer has a refractive index of about 1.45 to about 1.55.

10. A display device comprising:
a display panel comprising a plurality of display elements;

a window member on the display panel, the window member including a first surface facing the display panel and a second surface opposite to the first surface; and a plurality of first light conversion members that convert the path of light emitted from the display elements and directly contact the second surface of the window member, a plurality of second light conversion members on the first light conversion members and having cross sections that are about 450 nm to about 950 nm in diameter, wherein one of the plurality of second light conversion members directly contacts the one of the plurality of first light conversion members, wherein the first light conversion members comprise at least one selected from a plurality of nanoparticles and a plurality of nanofibers, and wherein the at least one selected from a plurality of nanoparticles and a plurality of nanofibers comprises a vinyl-based polymer.

11. The display device of claim 10, wherein cross sections of the first light conversion members are about 450 nm to about 950 nm in diameter.

12. The display device of claim 10, wherein the cross sections of the first light conversion members have a hemispherical shape or a circular shape.

13. The display device of claim 10, wherein the first light conversion members have a refractive index of about 1.45 to about 1.55.

14. The display device of claim 12, wherein the first light conversion members are irregularly arranged on the surface of the window member.

* * * * *